(12) United States Patent
Karst et al.

(10) Patent No.: US 9,305,790 B2
(45) Date of Patent: Apr. 5, 2016

(54) DEVICE AND METHOD FOR KNIFE COATING AN INK BASED ON COPPER AND INDIUM

(75) Inventors: Nicolas Karst, Folkling (FR); Simon Perraud, Bandol (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 72 days.

(21) Appl. No.: 14/113,664

(22) PCT Filed: May 3, 2012

(86) PCT No.: PCT/FR2012/000176
§ 371 (c)(1),
(2), (4) Date: Oct. 24, 2013

(87) PCT Pub. No.: WO2012/153017
PCT Pub. Date: Nov. 15, 2012

(65) Prior Publication Data
US 2014/0051245 A1 Feb. 20, 2014

(30) Foreign Application Priority Data
May 6, 2011 (FR) .................................. 11 01406

(51) Int. Cl.
*B05C 11/04* (2006.01)
*H01L 21/288* (2006.01)
*B05C 5/00* (2006.01)
(Continued)

(52) U.S. Cl.
CPC .............. *H01L 21/288* (2013.01); *B05C 5/001* (2013.01); *B05C 11/04* (2013.01); *H01L 21/4885* (2013.01); *H01L 31/0322* (2013.01); *H01L 31/18* (2013.01); *B05C 3/18* (2013.01);
(Continued)

(58) Field of Classification Search
CPC .... B05C 5/001; B05C 5/0254; H01L 21/288; H01L 31/0322; H01L 31/18; Y02E 10/541
USPC ...................... 118/58–59, 100, 202; 438/660; 427/356, 372.2, 375
See application file for complete search history.

(56) References Cited

U.S. PATENT DOCUMENTS

| 6,065,402 A * | 5/2000 | Feller et al. ................. 101/350.5 |
| 2011/0030786 A1* | 2/2011 | Fujdala et al. ................ 136/258 |
| 2011/0174444 A1 | 7/2011 | Delorme et al. |

FOREIGN PATENT DOCUMENTS

| DE | 92 08 951.8 U1 | 11/1992 |
| DE | 10 2004 032568 A1 | 1/2006 |

(Continued)

OTHER PUBLICATIONS

Kaelin et al., "Low-Cost CIGS Solar Cells by Paste Coating and Selenization," *Thin Solid Films*, 2005, vols. 480-481, pp. 486-490.
Ding et al., "Deposition of Hole-Transport Materials in Solid-State Dye-Sensitized Solar Cells by Doctor-Blading," *Organic Electronics*, 2010, vol. 11, pp. 1217-1222.
Jul. 6, 2015 Office Action issued in Chinese Application No. 201280021875.9.

*Primary Examiner* — Alexander Weddle
(74) *Attorney, Agent, or Firm* — Oliff PLC

(57) ABSTRACT

The device for knife coating a layer of ink based on copper and indium on a substrate includes a supply tank of an ink, said tank collaborating with a coating knife. In addition, the device includes means that allow the ink, the substrate and the coating knife to be kept at different and increasing respective temperatures.

15 Claims, 2 Drawing Sheets

(51) Int. Cl.
*H01L 31/032* (2006.01)
*H01L 31/18* (2006.01)
*H01L 21/48* (2006.01)
*B05C 5/02* (2006.01)
*B05C 3/18* (2006.01)

(52) U.S. Cl.
CPC ............. *B05C5/0254* (2013.01); *Y02E 10/541* (2013.01); *Y02P 70/521* (2015.11)

(56) References Cited

FOREIGN PATENT DOCUMENTS

| | | | |
|---|---|---|---|
| DE | 102004032568 A1 * | 1/2006 | ............ B05C 1/0834 |
| EP | 0 336 274 A2 | 10/1989 | |
| FR | 2 929 548 A1 | 10/2009 | |
| JP | 2006-068708 A | 3/2006 | |
| JP | A-2006-68708 | 3/2006 | |

* cited by examiner

DEVICE AND METHOD FOR KNIFE COATING AN INK BASED ON COPPER AND INDIUM

BACKGROUND OF THE INVENTION

The invention relates to a device and a deposition method by knife coaling of a layer of ink having a copper and indium base used in particular for producing solar cells.

STATE OF THE ART

Several techniques can he used to deposit a thin film on a substrate. For example, in the microelectronics field, deposition by evaporation, by chemical process, or by cathode sputtering are widely used for producing several types of thin films. However, for formation of thin films having a base formed by copper and indium on large surfaces, these techniques are hardly suitable on account of their complexity and of their high cost.

However, a deposition technique by coating of thin films with a copper and indium base has started to be increasingly adopted by manufacturers. The coating process is in fact a process that is not very onerous as it is not performed in a vacuum. Furthermore, it is commonly used on an industrial scale in widely varying fields such as plastics processing, papermaking etc. Among the different known types of coating, knife coaling or doctor blade is based on a principle which consists in placing a knife at a fixed distance from the substrate to be coated. Then the solution is distributed on the substrate, in front of the knife which is moved linearly over the whole of the substrate, which leads to formation of a continuous film of controlled thickness.

For example, production of CIGS solar cells (CIGS for copper, indium, gallium and selenium alloy) using a coaling technique is described in the article entitled "Low-cost CIGS solar calls by paste coating and selenization", by M. Kaelin et al. (Thin Solid Films, 480-481, 2005, p. 486-490). In this study, an ink comprising precursors with a copper, indium and gallium base was deposited or a substrate to produce thin films for solar cells. In order to obtain continuous thin films over large surfaces using a knife coating technique, particular attention has to be paid to the rheology of the ink and to the welting on the substrate. Generally, this type of ink, based on copper and indium, also comprises additives which act as binder between the particles.

The use of additives in the ink, before coaling, is performed with the sole purpose of adjusting the viscosity of the ink thereby guaranteeing deposition of a homogeneous layer on a relatively large surface. However, these additives can give rise to the occurrence of "parasite layers" or to a reduction of the "purity" of the composition of the thin films. M. Kaelin et al. for example observed the formation of a layer of carbon between the substrate and the CIGS layer after the selenization annealing. The formation of this carbon layer is attributed to the decomposition of ethyl cellulose, the additive used in the ink. This parasite carbon layer, interposed between the absorption layer and a contact layer of the substrate, gives rise to the occurrence of additional series resistances. For this reason, a clear impairment of the performances of these cells was observed.

OBJECT OF THE INVENTION

In certain applications, a requirement exists to provide a device for knife coating deposition of an ink based on copper and indium enabling homogeneous thin films to be produced on large surfaces, with optimal welting on the substrate when coating is performed and without requiring the use of additives to the ink.

This requirement tends to be met by providing a device for performing knife coating deposition of a layer of ink based on copper and sodium on a substrate, comprising an ink supply tank collaborating with a coaling knife, the device also comprising means for keeping the ink, the substrate and the coating knife at different and increasing respective temperatures.

A method for performing knife coating deposition of a layer of ink based on copper and indium on a substrate is also provided, by means of a coating knife, so that the ink, the substrate and the coating knife are kept at different and increasing respective temperatures.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

A reliable and inexpensive mean for performing deposition of ink based on copper and indium on a large surface for producing thin films with uniform thicknesses and morphologies consists in using a knife coating deposition device. The device comprises means for controlling the temperature of the ink and elements which are in contact with the ink, i.e. the substrate and the knife. More particularly, the ink, the substrate, and the knife are kept at different and increasing temperatures when coaling is performed.

Figure 1:
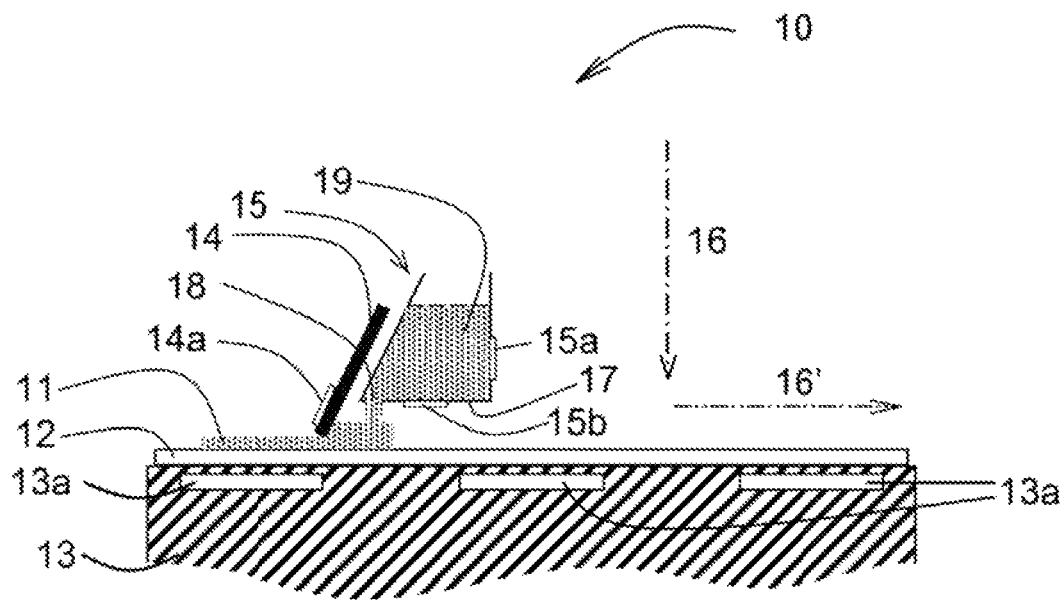
FIG. 1 represents knife coating deposition of a thin film according to a first embodiment according to the invention, in schematic manner, in cross-section.

FIG. 1 schematically illustrates a particular embodiment of a knife coating device 10 of an ink layer 11 based on copper and indium on a substrate 12. The device comprises a support 13 on which substrate 12 is arranged. Support 13 comprises a receiving plane, which is preferably horizontal, and control means 13a of the temperature of substrate 12. Temperature control means 13a can for example comprise a thermostat controlling conventional heating means. For example, heating of substrate 12 can be obtained by Joule effect or by electromagnetic induction. In the latter case, support 13 is provided with a thermostat controlling one or more coils in which an alternating current of predefined frequency flows.

As illustrated in FIG. 1, coating device 10 also comprises a coating knife 14 collaborating with a tank 15 for ink supply. Tank 15 is designed to store and supply an ink 19 based on copper and indium. Ink 19 can also contain gallium. Tank 15, in FIG. 1, comprises side walls extending in vertical and/or inclined directions with respect to support 13, from the peripheral edges of a bottom 17 up to a top surface (not shown). Bottom 17 comprises an opening 18 enabling to provide ink on substrate 12 to be coated. Hole 18 can also be arranged in one of the side walls of tank 15. In order to ensure dosed supply of ink 19 stored in tank 15, hole 18 can for example comprise a valve designed to regulate the volume of ink 19.

Furthermore, tank 15 and knife 14 are, in this embodiment, each provided with control means of the temperature respectively of ink 19 stored in tank 15 and of a part of knife 14 in contact with ink 19 distributed above substrate 12. In the same way as for support 13, these means can comprise thermostats and usual heating means. The temperature control means of support 13, ink 19 and knife 14 are further controlled to keep the respective temperatures of ink 19, substrate 12, and knife 14 different and increasing, during the coating operation.

According to a particular embodiment, tank 15 and/or knife 14 are formed by heat conducting materials. Tank 15 and knife 14 can for example be made from steel, aluminium or any other material enabling an efficient heat transfer. The temperature control means respectively associated with tank 15 and knife 14 can comprise heating elements 15a, 15b and 14a. Healing elements 15a and 15b associated with tank 15 are located in the side walls and/or the bottom of ink 15. They enable the content of the tank to be heated by means of a heat transfer, facilitated by the thermal conductivity of the material of tank 15. In similar manner, knife 14 comprises a heating element 14a which enables the temperature of the surface of knife 14 in contact with ink 19 distributed on substrate 12 to be controlled. Each of heating elements 15a, 15b and 14a is in addition advantageously controlled by a thermostat.

As illustrated in FIG. 1, in order to deposit an ink layer 11 on substrate 12, knife 14 is disposed in a first coating position. The coating position corresponds to the position in which knife 14 is placed at a fixed distance from substrate 12, comprised for example between 5 μm and 500 μm. This fixed distance separating knife 14 from substrate 12 in particular enables the thickness of ink layer 11 deposited on substrate 12 to be fixed.

In preferential manner, tank 15 and knife 14 can be provided with movement means with respect to support 13 (not represented in the figures). Such movement means enable knife 14 and tank 15 to move in a vertical direction 16 and/or a horizontal direction 16' with respect to substrate 12. These movement means thus enable the knife to move from a rest position to the coaling position when the coating operation is performed.

Figure 2:
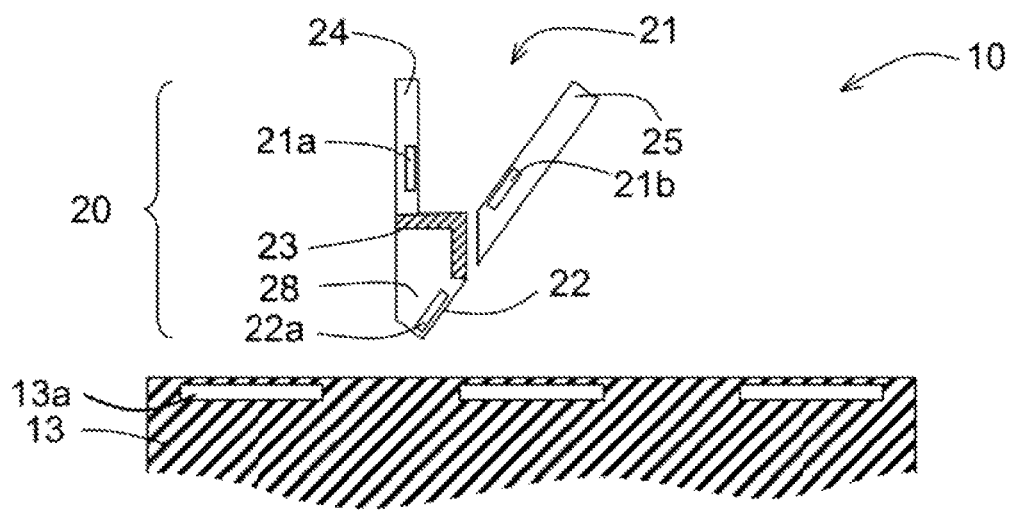
FIG. 2 represents a second embodiment of knife coating deposition according to the invention, in schematic manner, in cross-section.

According to another particular embodiment illustrated in FIG. 2, coating device 10 comprises a supply tank 21 and a coating knife 22 which are securely attached to one another and which form a single element 20. They are separated from one another by a layer 23 of thermally insulating material.

Element 20 is further provided with movement means similar to the means described for the embodiments illustrated in FIG. 1. In particular, element 20 comprises at least two side walls 24 and 25 participating in formation of supply tank 21 and coating knife 22. Preferably, at least one side wall extends in an inclined direction with respect to support 13. On the continuity of one of the side walls, for example inclined wall 25, an area 28 is arranged underneath tank 21. This area 28 comprises a flat outer surface constituting coating knife 22. As illustrated in FIG. 2, element 20 also comprises a layer 23 arranged in such a way as to thermally insulate supply tank 21 from area 28 comprising coating knife 22. Tank 21 and coating knife 22 are in addition provided with temperature control means comprising heating elements 21a, 21b and 22a similar to the means described for the previous embodiments. The temperature of ink 19 stored in tank 21 and the temperature of coating knife 22 can thus be adjusted separately.

Element 20 contributes to simplification of the structure of coating device 10 making for ease of use and of maintenance. Element 20 of device 10 does in fact advantageously serve the purpose of supply tank and of coating knife. Device 10 further comprises single movement means for element 20.

Figure 3:
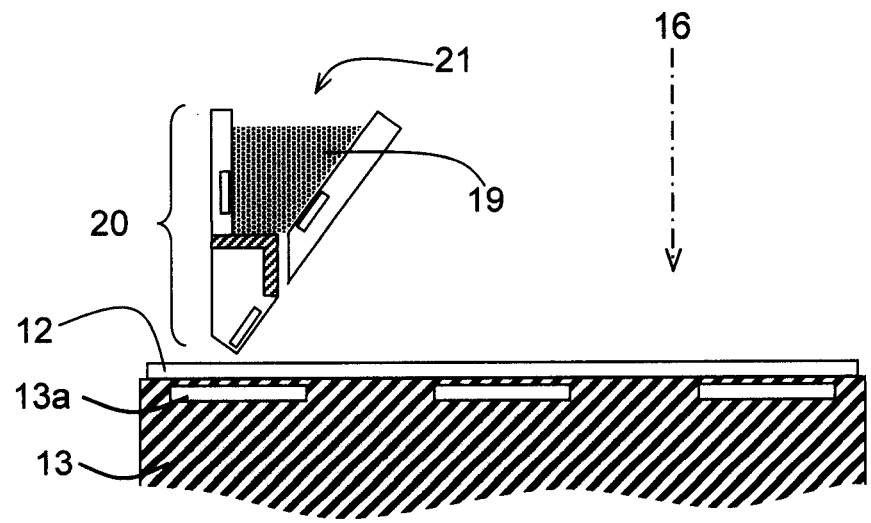
FIGS. 3 and 4 represent successive steps of a deposition method of thin films by coating according to the invention, in schematic manner, in cross-section.
Figure 4:
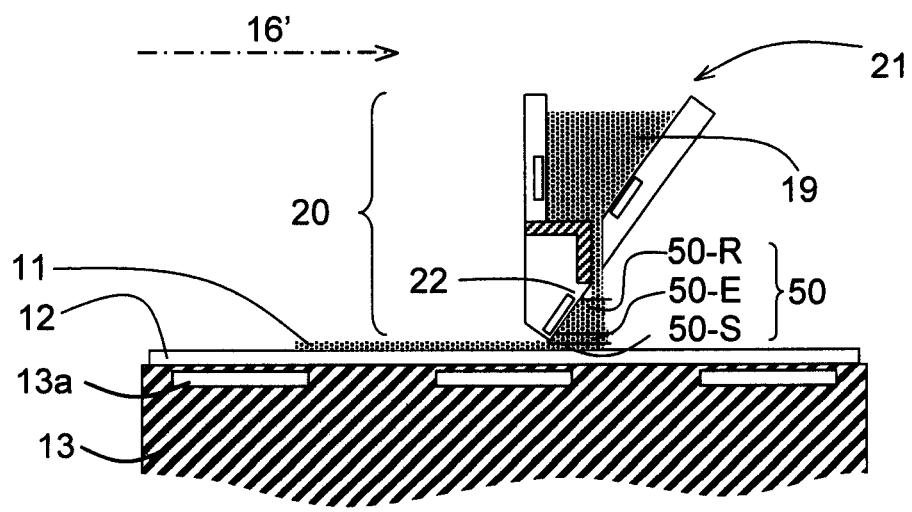

FIGS. 3 and 4 illustrates a particular embodiment of knife coating deposition of a layer of ink based on copper and indium 11 on a substrate 12 using device 10 according to FIG. 2. In particular, the deposited layer is advantageously a thin film with a copper and indium base or a copper, indium and gallium base, designed to be used in a photovoltaic cell production process.

Substrate 12 can have a base formed by any material on which an ink layer 11 can be deposited. Substrate 12 is for example formed by a soda lime glass covered by a layer formed by an electrically conducting material. In a particular embodiment this layer is formed by a thin film of molybdenum (Mo) with a thickness of about 400 nm.

Ink 19 in particular has a base formed by copper and indium precursors. Preferably, if is an ink suitable for producing CIS or GIGS layers on substrate 12. According to a particular embodiment, ink 19 also comprises a gallium precursor. For example, ink 19 comprises particles of a gallium and indium alloy and copper particles dispersed in an organic solvent such as ethanol or a thiol-based organic solvent ink 19 advantageously does not require additives of binder or dlspersant type such as ethyl cellulose or other polymers.

According to a preferred embodiment, the ratio (Ga/In+ Ga) between the gallium concentration and the sum of the concentrations of indium and of gallium in ink 19 is comprised between 0.2 and 0.5. This concentration ratio (Ga/In+ Ga) of ink 19 advantageously enables the width of the bandgap of the CIGS layer to be controlled so as to obtain a better solar radiation absorption efficiency. The conversion efficiency of solar cells using CIGS thin films is thereby improved.

According to another embodiment which can be combined with the previous embodiment, the ratio (Cu/Cu+In+Ga) between the copper concentration and the sum of the copper, indium and gallium concentrations is comprised between 0.7 and 1.0. Such a ratio can be called composition ratio. A thin film of CIGS comprising a copper concentration respecting this condition enables the conversion efficiency of solar cells to be improved. A low composition ratio (Cu/Cu+In+Ga) in fact generally gives rise to formation of a single chalcopyrite phase that has a low copper content, with a small grain size, which impairs the conversion efficiency of the cells. When the composition ratio (Cu/Cu+In+Ga) is greater than 1, a two-phase compound is generally formed, it comprises chalcopyrite and $Cu_xSe$ impurities. On account of their high electric conductivity, these impurities result in a decrease of the conversion efficiency of light.

As illustrated in FIG. 3, ink 19 is contained in a storage and supply tank 21 of a coating deposition device so that ink 19 is kept at a temperature $T_E$. Before supplying ink 19 on substrate 12, the latter is kept at a higher temperature $T_S$ than the temperature $T_E$ of ink 19. Element 20 is then moved in a vertical direction 16 with respect to support 13 so as to place element 20 in the cooing position, i.e. at a predefined distance from the surface to be coated.

Then, as illustrated in FIG. 4, ink 19 is disposed on substrate 12. Coating knife 22 is kept at a higher temperature $T_R$ than the temperature $T_S$ of substrate 12. Coating element 20 and substrate 12 move with respect to one another in a horizontal direction 16' with respect to substrate 12. This linear movement enables the formation of a continuous thin film of ink 11 on substrate 12 with a controlled thickness. The movement means enable substrate 12 and element 20 to move with respect to one another at an optimal speed, which enables supplying of an adequate volume 50 of ink 19 on substrate 12 before coating.

Keeping the temperatures of ink 19, substrate 12 and coating knife 22 respectively at temperatures $T_E$, $T_S$, and $T_R$, which are different and increasing respective temperatures, advantageously enables a temperature gradient to fee fixed within volume 50 of ink 19 when the coating operation is performed. Indeed, as illustrated in FIG. 4, volume 50 comprises an area 50-R located in proximity to coating knife 22, and therefore at a temperature $T_{50-R}$ close to the temperature $T_R$. Volume 50 also comprises a second area 50-S located in proximity to substrate 12, which keeps this second area at a temperature $T_{50-S}$ close to the temperature $T_S$ of substrate 12. A third area 50-E is arranged between the first and second areas 50-S and 50-R. The third area is sufficiently distant from coating knife 22 and from substrate 12 to have a temperature $T_{50-E}$ close to the temperature $T_E$ of ink 19. Consequently, volume 50 arranged above substrate 12 has a temperature gradient such that $T_{50-E}<T_{50-S}<T_{50-R}$. This temperature gradient induces a viscosity gradient such that $\eta_{50-E}<\eta_{50-S}<\eta_{50-E}$ where $\eta_{50-R}$, $\eta_{50-S}$, $\eta_{50-E}$ respectively represent the viscosities of areas 50-R, 50-S and 50-E. The viscosity gradient thus generated advantageously enables optimal wetting of ink 19 on substrate 12. Thin film 11, with a base formed by ink 19, deposited on substrate 12 is therefore a homogeneous layer with a uniform morphology.

Optimization of the temperatures of the areas of volume 50 of ink distributed on substrate 12 advantageously enables optimal wetting of ink 19 to be obtained on substrate 12, without addition of additives in ink 19. Preferably, the difference between the respective temperatures of ink 19 and substrate 12 is comprised between 20° C. and 100° C. and/or the difference between the respective temperatures of substrate 12 and coating knife 22 is comprised between 20° C. and 100° C. These differences between the temperatures of these three elements advantageously enable an optimal temperature gradient of volume 50 of ink distributed on substrate 12 to be obtained. This temperature gradient generates a controlled viscosity gradient of volume 50 so as to improve wetting of ink 19 deposited on substrate 12.

According to a preferred embodiment which can be combined with the previous embodiment, the temperature of ink $T_E$ is comprised between 20° C. and 100° C. Ink 19 preferably has a viscosity comprised between 0.005 and 0.00 Pa·s at a shear rate of 500 s$^{-1}$. These temperature and viscosity ranges of ink 19 advantageously improve the quality of wetting of ink 19 deposited on substrate 12. According to this preferred embodiment, and by respectively fixing the temperatures of ink 19, substrate 12 and knife 22 at 30° C., 50° C. and 100° C. a thin film with a copper, indium and gallium base, with a thickness of 3 µm, was deposited on a surface of 20 cm². The film thus deposited by knife coating is a continuous homogeneous layer and has a uniform morphology.

The invention claimed is:

1. A knife coating device for deposition of a copper and indium based ink layer, on a substrate, comprising:
   an ink supply tank;
   a coating knife collaborating with the ink supply tank;
   heaters configured to adjust temperatures of the substrate, the ink in said supply tank, and the coating knife;
   a controller of the heaters configured so as to keep the temperature of the ink lower than the temperature of the substrate, the temperature of the substrate being kept lower than the temperature of the coating knife.

2. The device according to claim 1, wherein the supply tank and the coating knife are securely attached to one another and separated by a layer made from thermally insulating material.

3. The device according to claim 1, wherein the ink supply tank is formed by a heat conducting material, and comprises a first heating element configured to adjust the temperature of the ink in said supply tank.

4. The device according to claim 1, wherein the coating knife is formed by a heat conducting material, and comprises a second heating element configured to adjust the temperature of the coating knife.

5. The device according to claim 1 wherein the ink comprises gallium.

6. A knife coating deposition method for deposition of an ink layer on a substrate, the method comprising:
   providing a copper and indium based ink;
   providing a coating knife; and
   depositing the copper and indium based ink onto a substrate by knife coating using the coating knife while keeping the temperature of the copper and indium based ink lower than the temperature of the substrate, and while keeping the temperature of the substrate lower than the temperature of the coating knife.

7. The deposition method according to claim 6, wherein the temperature of the copper and indium based ink is kept at a temperature between 20° C. and 100° C.

8. The method according to claim 6, wherein the viscosity of the copper and indium based ink is between 0.005 Pa.s and 0.08 Pa.s, at a shear rate of 500 s$^{-1}$.

9. The deposition method according to claim 6, wherein the difference between the temperature of the substrate and the temperature of the copper and indium based ink is between 20° C. and 100° C.

10. The deposition method according to claim 6, wherein the difference between the temperature of the coating knife and the temperature of the substrate is between 20° C. and 100° C.

11. The deposition method according to claim 10, wherein the ratio between the gallium concentration and the sum of the indium and gallium concentrations in the copper and m based ink is between 0.2 and 0.5.

12. The deposition method according to claim 6, wherein the copper and indium based ink further comprises gallium.

13. The deposition method according to claim 12, wherein the ratio between the copper concentration and the sum of the copper, indium and gallium concentrations in the copper and indium based ink is between 0.7 and 1.0.

14. The deposition method according to claim 6, wherein the coating knife is separated from the substrate during the depositing.

15. The deposition method according to claim 6, wherein the temperature of the copper and indium based ink, the temperature of the substrate, and the temperature of the coating knife are controlled during the depositing.

* * * * *